United States Patent [19]

Glaise

[11] Patent Number: 5,694,407
[45] Date of Patent: Dec. 2, 1997

[54] METHOD AND AN APPARATUS FOR MODIFYING A FCS

[75] Inventor: Rene Glaise, Nice, France

[73] Assignee: International Business Machines Corporation, Armonk, N.Y.

[21] Appl. No.: 620,437

[22] Filed: Mar. 22, 1996

[30] Foreign Application Priority Data

Mar. 31, 1995 [EP] European Pat. Off. ............ 95480032

[51] Int. Cl.$^6$ ............................ G06F 11/10; H03M 13/00
[52] U.S. Cl. ............................................. 371/53; 371/37.1
[58] Field of Search ........................ 371/53, 37.6, 37.8, 371/37.9, 37.1, 40.3, 41, 48

[56] References Cited

U.S. PATENT DOCUMENTS

| 4,473,902 | 9/1984 | Chen ............................. 371/37.1 |
| 5,131,012 | 7/1992 | Dravida ........................ 375/108 |
| 5,539,756 | 7/1996 | Glaise et al. ................. 371/37.1 |
| 5,619,516 | 4/1997 | Li et al. ........................ 371/53 |

FOREIGN PATENT DOCUMENTS

| 0313707 | 10/1987 | European Pat. Off. . |
| 9415407 | 7/1994 | WIPO . |

OTHER PUBLICATIONS

IBM Journal of Res. & Dev., vol. 33, No. 6, Nov. 1989 pp. 618–626.

IEEE Trans. on Comm. vol. 40, No. 6, 6092, pp. 989–991.

Primary Examiner—Phung Chung

[57] ABSTRACT

In intermediate network nodes of high speed packet switching networks, when a message is modified, the invention proposes a method and an apparatus for calculating a modified FCS error code. Using the properties of calculations in the Galois Field, the implementation of the invention, specially in the intermediate Frame Relay network nodes, is reduced to a plurality of simple well known operators (90, 100, 120, 30); the implementation of the invention allows the usage of a plurality of small lookup tables (60, 70, 80, 110) as desired and thus avoiding large amounts of storage resources.

14 Claims, 7 Drawing Sheets

| | |
|---|---|
| $a^0$ | 0000000000000001 |
| $a^1$ | 0000000000000010 |
| $a^2$ | 0000000000000100 |
| $a^3$ | 0000000000001000 |
| $a^4$ | 0000000000010000 |
| $a^5$ | 0000000000100000 |
| $a^6$ | 0000000001000000 |
| $a^7$ | 0000000010000000 |
| $a^8$ | 0000000100000000 |
| $a^9$ | 0000001000000000 |
| $a^{10}$ | 0000010000000000 |
| $a^{11}$ | 0000100000000000 |
| $a^{12}$ | 0001000000000000 |
| $a^{13}$ | 0010000000000000 |
| $a^{14}$ | 0100000000000000 |
| $a^{15}$ | 1000000000000000 |
| $a^{16}$ | 0001000000100001 |
| $a^{17}$ | 0010000001000010 |
| $a^{18}$ | 0100000010000100 |
| $a^{19}$ | 1000000100001000 |
| $a^{20}$ | 0001001000110001 |
| ---- | ---- ETC ---- |
| $a^{32760}$ | 0100011000101000 |
| $a^{32761}$ | 1000110001010000 |
| $a^{32762}$ | 0000100010000001 |
| $a^{32763}$ | 0001000100000010 |
| $a^{32764}$ | 0010001000000100 |
| $a^{32765}$ | 0100010000001000 |
| $a^{32766}$ | 1000100000010000 |

FIG. 3

METHOD AND AN APPARATUS FOR MODIFYING A FCS

FIELD OF THE INVENTION

This invention deals with the calculation of error-detecting code in the intermediate network nodes of high speed packet switching networks such as Frame Relay or ATM (Asynchronous Transfer Mode) networks.

BACKGROUND OF THE INVENTION

With the high reliability of physical line technologies, such as optical fibers, used today in high speed digital networks, the validity of the information conveyed through the network is checked only at the destination. In packet switching networks, error-detecting codes such as Cyclic Redundancy Codes (CRC) are used to perform this information validity checking. In high speed packet-switching networks the information transported may be either voice or data and require a constant concern for performance.

CRC is often used because it is easy to implement and it detects a large class of errors. Redundancy bits (also referred to as Frame Check Sequence, FCS) are added to each data frame inside the packet by the originating system or as it enters the network. The frame is checked for errors at the remote end. When the data frames are modified in the intermediate network nodes, the FCS must not be recomputed at this node level: if bits errors are introduced by the intermediary while the text is unprotected, these errors will be undetectable by the final CRC checking. The FCS is modified rather than recomputed at the intermediate network nodes.

The main drawback of the CRC calculation using the usual LFSR (Linear Feedback Shift Register) is the computation time, which takes as many clock pulses as the number of bits of data. The required compensation time is not acceptable from a performance point of view. The CRC calculation in high speed networks must not jeopardize the computing resources at the intermediate network nodes and consequently the transit delay in the network. Applying, to CRC computation, the properties of calculation in Galois Fields pointed out by D. R. Irvin in IBM J. RES. DEVELOP. VOL. 33 NO. 6 NOVEMBER 1989 and by Aram Perez and Wismer & Becker, in an article on CRC calculation in the June 1983 IEEE publication, European patent application EP-94480036 has proposed a method and apparatus to reduce the computing resources in the intermediate network node in terms of number of processor cycles and memory space.

The invention disclosed in that application uses the polynomial representation of the bit stream messages and the error code CRC calculations, particularly the FCS error codes, calculated with the Galois Field generated by the generator polynomials as those provided in the CCITT recommendation (knowing that the polynomial representation of the Galois Field elements are polynomials with coefficients equal to 0 or 1, the operations on these coefficients being modulo 2 operations). The FCS calculation of a bit stream message uses the calculation of the remainder of the polynomial division of the polynomial representing the message bit stream by the generator polynomial corresponding to the error code. The FCS calculations are therefore based on the properties of the Galois Fields as described in 'Error Correcting Codes' of Peterson & Weldon, second edition, 1972, and use also the simplifications as proposed in the article 'A Method for Updating a Cyclic Redundancy Code' of Michael Gutman published in the 'TRANSACTIONS ON COMMUNICATIONS' magazine, VOL. 40, NO 6, JUNE 1992.

The application EP-94480036 assumes that for an input message M modified (M') in the intermediate network node, the final bit stream error code bit (fFCS) can be efficiently calculated knowing the initial error code of the message (iFCS) and the distance m from the last bit of the modified field of the message to the last Least Significant Bit (LSB) of the message.

$$iFCS = Rem_G(X^g \times M + X^k L) \quad L = X^{g-1} + X^{g-2} + X + 1$$
$$fFCS = Rem_G(X^g \times M' + X^k L) \quad k = \text{degree of } M = \text{degree of } M'$$
$$g = \text{degree of } G$$
$$fFCS - iFCS = Rem_G(X^g \times M + X^k \times L) - Rem_G(X^g \times M' + X^k \times L)$$
$$fFCS - iFCS = Rem_G(X^g \times M + X^k \times L - X^g \times M' - X^k \times L)$$
$$fFCS - iFCS = Rem_G(X^g \times (M-M'))$$

+ and and × are the addition and multiplication of polynomials having their coefficients equal to 0 or 1.

M−M' is the bit stream or its polynomial representation for the difference between the two messages. The difference is located on a modified bit stream field of the initial message M.

G is the generator polynomial of the Galois Field $Rem_G$ is the remainder of the polynomial division by G.

$$M-M' = \Delta \text{ vector} \times X^d$$

d is the distance between the end of the modified field in the initial message and the end of the message itself.

$X^d$ Is the polynomial representation of the bit stream vector 'displacement of d' represented by the bit stream '0 ... 010 ... 0' where the only non zero bit is at the d position.

Δ vector being the bit stream representing the difference between the input message M and the modified message M'; this bits field length being the length of the field in the initial message which has been modified in the intermediate network node.

$$fFCS = iFCS + Rem_G(X^g \times (M-M'))$$
$$fFCS = iFCS + Rem_G(X^g \times (\Delta \text{ vector} \times X^d)) \quad \text{(expression 0)}$$

$$fFCS = iFCS + Rem_G((X^g \times \Delta \text{ vector}) \times X^d)$$
$$fFCS = iFCS + Rem_G(Rem_G(X^g \times \Delta \text{ vector}) \times Rem_G(X^d))$$
$$fFCS = iFCS + Rem_G(Rem_G(X^g \times \Delta \text{ vector}) \times \alpha^d)$$
$$fFCS = iFCS + Rem_G(X^g \times \Delta \text{ vector}) \otimes \alpha^d$$

⊗ is the sign of the multiplication in the Galois Field. It is a two step operation comprising a first step to multiply the two polynomials and a second step to take the remainder of the result in the division by G.

α is an irreducible polynomial root of the Galois Field generated by G.

$\alpha^d$ is the element of the Galois Field corresponding to the distance d. $\alpha^d = Rem_G(X^d)$.

$$fFCS = iFCS + Rem_G(M-M')$$
$$fFCS = iFCS + Rem_G(X^g \times \Delta \text{ vector}) \otimes \alpha^d \quad \text{(expression 1)}$$

FIG. 1 illustrates the bit streams used during the successive steps described above for calculation of the final FCS. On the first bit stream line (1) is drawn the initial bit stream message M with its initial FCS (iFCS). The second line (3) illustrates the message which has been modified M' and the corresponding altered bit stream field; m is the distance between the end of the altered field and the end of the message. fFCS if the final FCS to be calculated. At the third line (5) the difference M–M' is represented with its non zero field corresponding to the altered field in the initial message M. The bit stream line 6 represents the Δ vector which is used for fFCS calculation. On line 7 is represented the bit stream corresponding to $X^g$(Δ vector).

OBJECT OF THE INVENTION

It is a first object of the invention to provide a simple and fast method and apparatus to calculate the modified FCS of the messages which have been modified in an intermediate network node. More particularly, this invention provides a method and an apparatus to calculate the following expression:

$$fFCS = iFCS + Rem_G(X^g \times \Delta \text{ vector}) \otimes \alpha^d \quad \text{(expression 1)}$$

It is another object of the invention to avoid large tables in memory.

Furthermore, the invention intends to provide a general solution which applies to all kinds of FCS length with no fixed number of lookup tables and simple operations.

SUMMARY OF THE INVENTION

The subject invention relates to a method to calculate a modified Frame Check Sequence (FCS) of bit stream messages (M) conveyed in a packet switching network using a FCS error code based on a generator polynomial G generating a Galois Field when the root is α, knowing that one bit stream field has been modified in said messages; m being the distance from the last bit of the modified field of the message to the Least Significant Bit of the message including the FCS bits. The method has the steps of storing the elements of the Galois Field corresponding to said FCS error code and determining in the data stored to the element in the Galois Field $\alpha^m$ corresponding to m.

In addition

The delta vector resulting in the difference between the initial and the final bit stream messages not including the FCS bits is calculated.

The remainder in the division by the generator polynomial of the delta is calculated. If the length of the modified bits field is smaller than the degree of G, the remainder being the delta vector itself; performing a Galois Field multiplication of the result of the previous step with said remainder.

The result of the previous step is added to the initial error code, the result being the final error code which is the error code of the modified message.

BRIEF DESCRIPTION OF THE DRAWINGS

FIG. 3 represents a part of the Galois Field generated by the CCITT generator polynomial of degree 16.

DETAILED DESCRIPTION OF THE PREFERRED EMBODIMENT

Figure 1:
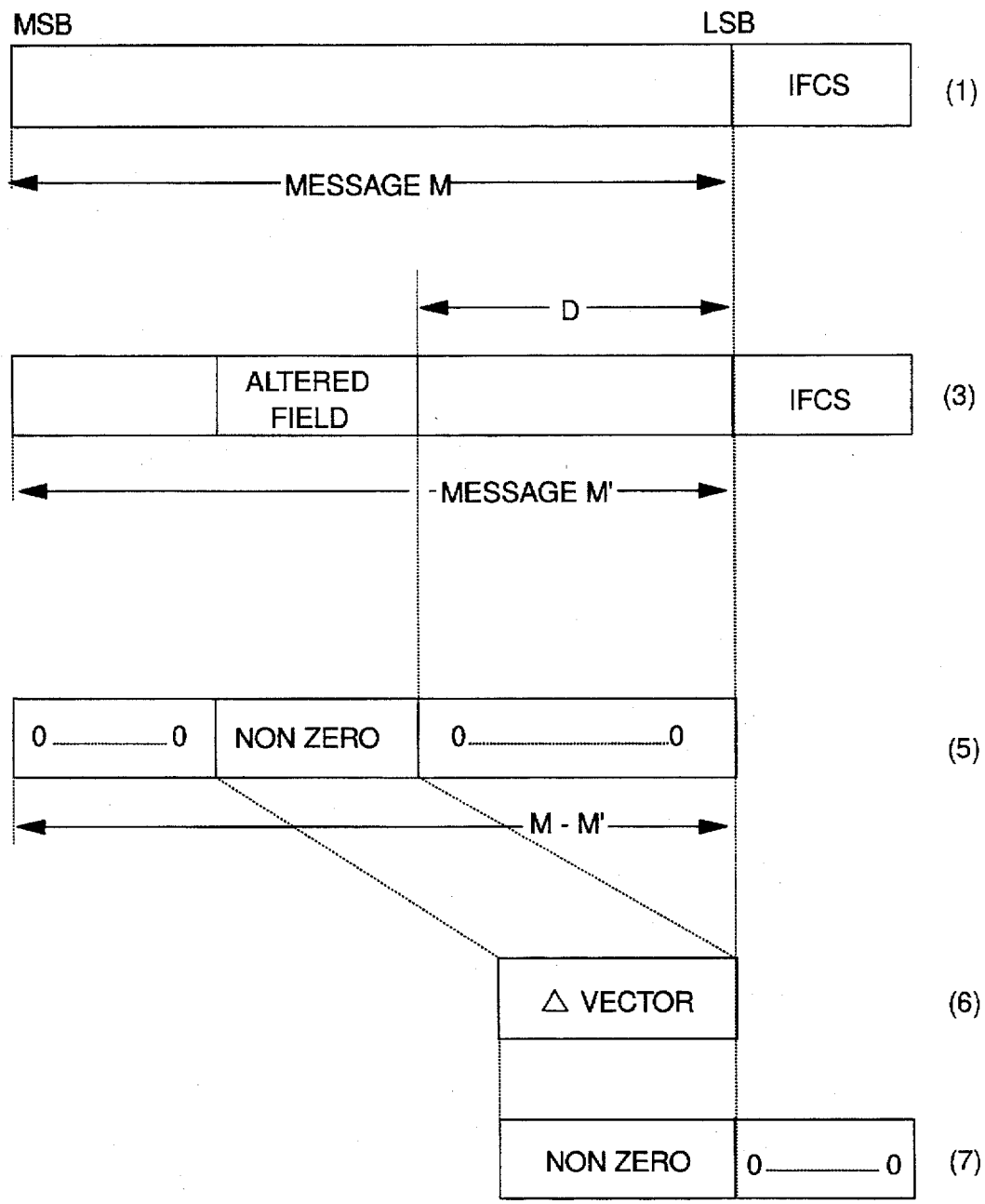
FIG. 1 illustrates the usage of the message fields for fFCS calculation.
Figure 2:
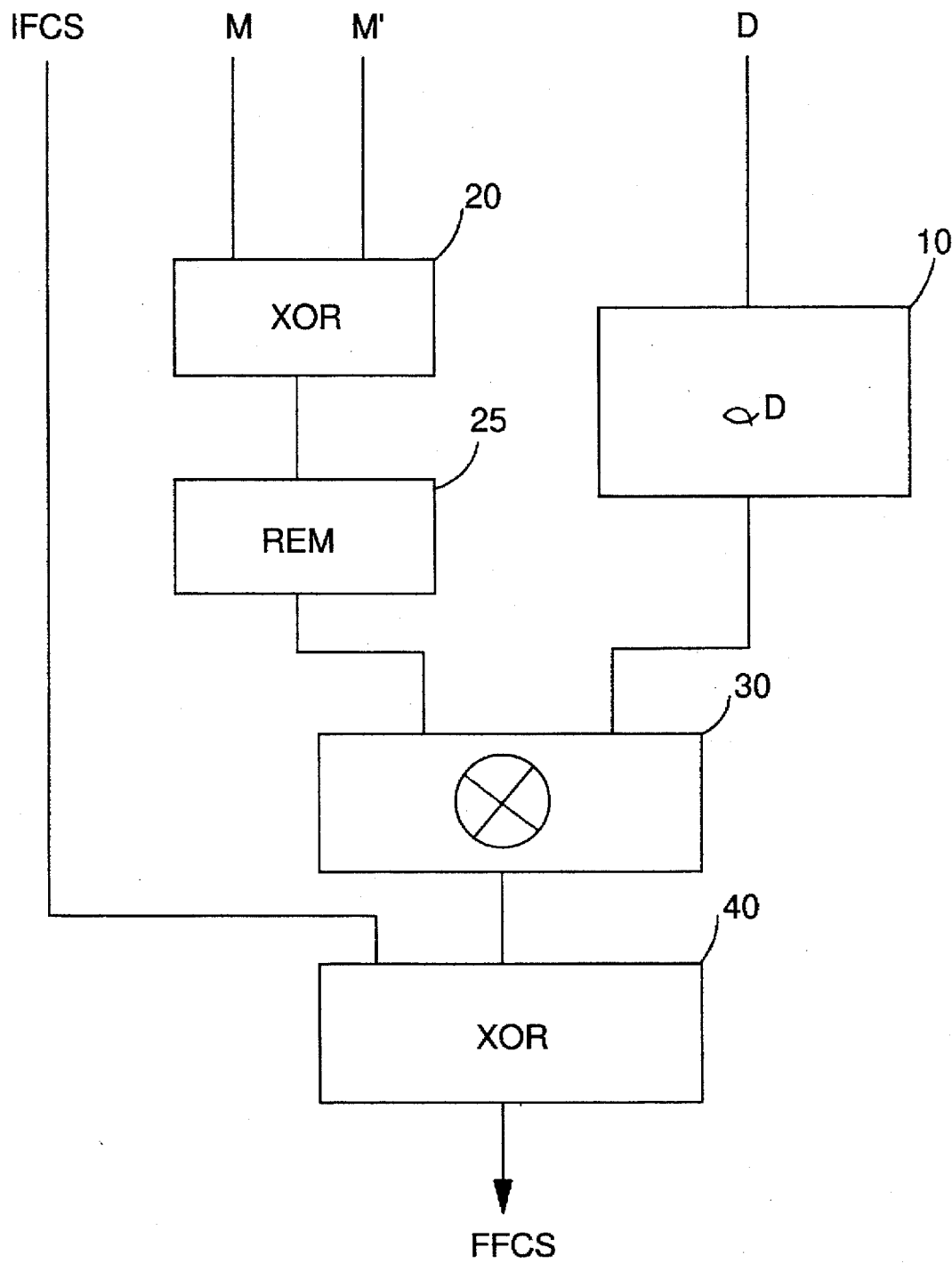
FIG. 2 is a logical block diagram of the general method of the invention

In implementing the equation, $$fFCS = iFCS + Rem_G(X^g \times \Delta \text{ vector}) \otimes \alpha^d \quad \text{(expression 1)}$$

the logical block diagram of FIG. 2 illustrates the general method of the invention for calculating the modified FCS of a message M entering the intermediate network node and modified (M') in this node. One block (10) is for determining the element in the Galois Field generated by the generator polynomial G corresponding to d, the distance between the last bit of the altered field and the last bit of the message M; it is represented as $\alpha^d$, α being the root of the Galois Field. The second block (20) is for the calculation of Δ vector which is the difference between the field which is to be altered in the input message M and the resulting altered field of the modified message M'. The output of block 20 which is the Δ vector is the input of block 25 in which is calculated $Rem_G(X^g \times \Delta$ vector). The block 30 consists in performing a multiplication in the Galois Field on the output of blocks 10 and 25; this means multiplying the two bit streams corresponding to $\alpha^d$ and $Rem_G(X^g \times \Delta$ vector) and taking the remainder of the division of the result of the multiplication by the generator polynomial G. The last block (40) is for performing an addition (polynomials with coefficients equal to 0 or 1) of the two bit streams corresponding to the FCS of the initial message and the output of block 30.

To perform the block 10 of the general method illustrated in FIG. 2, the invention proposes to use the known principle of pre-storing data in a lookup table. As the Galois Field is cyclic there is a limited number of elements which can be pre-stored in a lookup table. Knowing d, $\alpha^d$ will be the element of the Galois Field corresponding to the value congruent to d modulo the length of the Galois Field, 1. Implementing these operations inside block 10 requires an adder modulo 1 and a large table to be stored which may pass the storage capacities of the equipment where such operations are to be implemented.

That is the reason why the invention proposes to suppress the large table in the first process proposed, simplifying the calculations by use of some properties of the Galois Fields.

Using the properties of the polynomial multiplication we may calculate a new expression 1 as follows:

$$fFCS = iFCS + Rem_G (X^g \times (\Delta \text{ vector} \times X^d)) \quad \text{(expression 0)}$$
$$fFCS = iFCS + Rem_G (\Delta \text{ vector} \times (X^d \times X^g))$$
$$fFCS = iFCS + Rem_G (Rem_G (\Delta \text{ vector}) \times Rem_G(X^{d+g}))$$
$$fFCS = iFCS + Rem_G (\Delta \text{ vector}) \otimes \alpha^{d+g}$$

d+g is the distance in the bit stream representing the message M between the end of the modified field and the end of the message including the FCS field.

$$m = d + g$$
$$fFCS = iFCS + Rem_G (\Delta \text{ vector}) \otimes \alpha^m \quad \text{(expression 1')}$$

Now, in a Galois Field of 1 elements and for which the root is α, we have the following known property:

if $m = i + j$ modulo 1      (expression 2)
$\alpha^m = \alpha^i \otimes \alpha^j$      (expression 3)
$fFCS = iFCS + Rem_G (\Delta \text{ vector}) \otimes \alpha^i \otimes \alpha^j$      (expression 4)

In the expression 4, illustrating the splitting as proposed in the subject invention, one can see two differences with the expression 1 as proposed in the prior art. First of all, the unique multiplication in the Galois Field ⊗ of expression 1 is replaced by a succession of multiplications in the Galois Field in expression 4. The number of operations is not fixed; it depends on the number of terms into which the initial value, m has been split (expression 2). The second difference is that, in expression 1, instead of determining one Galois Field element, $\alpha^m$, with one access to a unique lookup table, with expression 4 the elements $\alpha^i$, $\alpha^j$ will be determined, each of them requiring one access to a smaller lookup table. As explained later, an object of the invention, is to replace the unique large table by a plurality of small tables.

The m bit stream can be split into a sum of as many bit stream as desirable. If we suppose m is a 11 bit stream split into three bit fields, one of 5 bits, the second of 4 bits and the third bit field in 2 bits, we have:

$$m = \Sigma\, a_n 2^n \quad a_n = 0 \text{ or } 1, n = 0 \text{ to } 11$$

$$m = i + j + k$$

$$i = \Sigma\, a_n 2^n \quad a_n = 0 \text{ or } 1, n = 0 \text{ to } 4$$

If we define the integer I as follows:

$$I = \Sigma\, 2^n \quad n = 0 \text{ to } 4$$

$$I = 2^5 - 1 = 31$$

$\alpha^i$ will be found in a table containing the I+1 (32) GF elements:

$$\alpha^0, \alpha^1, \alpha^2, \ldots \alpha^{31}$$

$$j = \Sigma\, a_n 2^n \quad a_n = 0 \text{ or } 1, n = 5 \text{ to } 8$$

$$j = 2^5\, \Sigma\, a_n 2^n \quad a_n = 0 \text{ or } 1, n = 0 \text{ to } 3$$

$$2^5 = I + 1$$

$$j = (I+1) \Sigma\, a_n 2^n \quad a_n = 0 \text{ or } 1, n = 0 \text{ to } 3,$$

If we define the integer J as follows:

$$J = \Sigma\, 2^n \quad n = 0 \text{ to } 3$$

$$J = 2^4 - 1 = 15$$

$\alpha^j$ will be found in a table containing the J+1 (16) GF elements:

$$\alpha^0, \alpha^{I+1}, \alpha^{2(I+1)} \ldots \alpha^{J(I+1)}$$

$$k = \Sigma\, a_n 2^n \quad a_n = 0 \text{ or } 1, n = 9 \text{ to } 10$$

$$k = 2^9\, \Sigma\, a_n 2^n \quad a_n = 0 \text{ or } 1, n = 0 \text{ to } 1$$

$$2^9 = 2^5 \times 2^4 = (I+1) \times (J+1)$$

If we define the integer K as follows:

$$K = \Sigma\, 2^n \quad n = 0 \text{ to } 1$$

$$K = 2^2 - 1 = 3$$

$\alpha^k$ will be found in a table containing the K+1 (4) GF elements:

$$\alpha^0, \alpha^{(I+1)(J+1)}, \alpha^{2(I+1)(J+1)} \ldots \alpha^{K(I+1)(J+1)}$$

Thus the initial large table containing all the elements of the Galois Field corresponding to the generator polynomial of the FCS is split into smaller tables.

Figure 7:
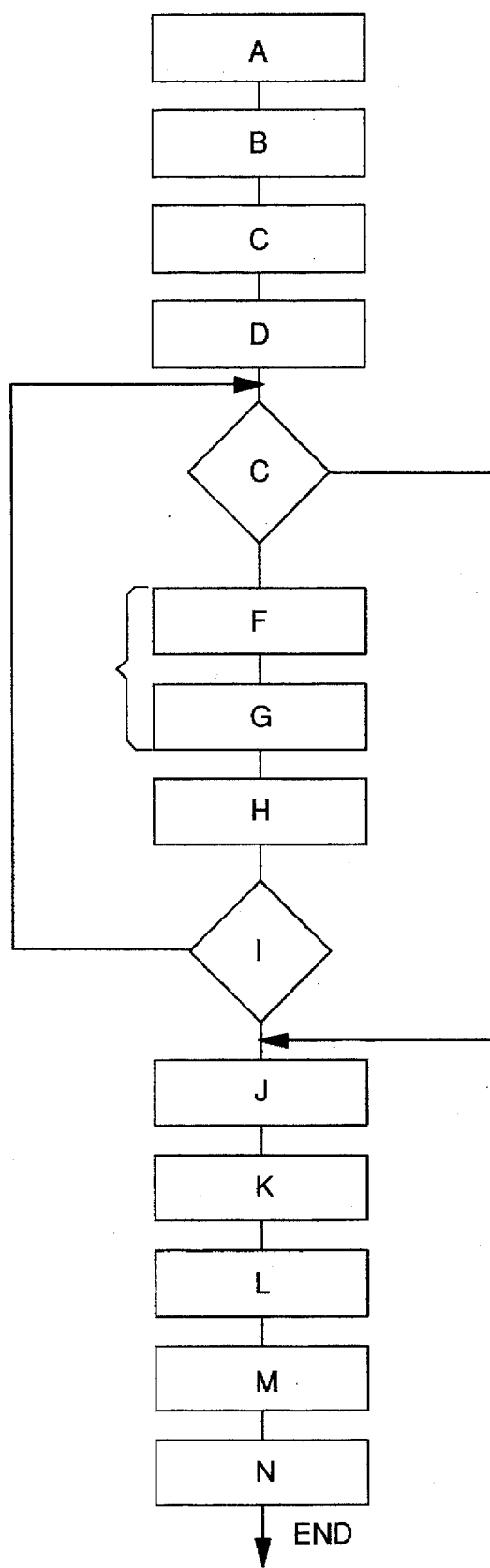
FIG. 7 is the flow chart of the general method for fFCS calculation.

FIG. 7 is the flow chart of the general method to calculate the modification of a FCS for a message having one field modified. The general method comprises the following steps:

a—Knowing the distance in bits between the end of the modified bit stream field in the message and the LSB of said message, m is this distance if it is smaller than the length, l, of the Galois Field corresponding to the FCS error-detecting code; if the distance is greater than l, m is calculated as the number congruent to the distance modulo l; splitting the m bit stream into the sum of the following plurality of i, j, k . . . bit streams:

$$m = i + j + k$$

$$i = \Sigma\, a_n 2^n \quad a_n = 0 \text{ or } 1, n = 0 \text{ to } li - 1$$

$$j = \Sigma\, a_n 2^n \quad a_n = 0 \text{ or } 1, n = li \text{ to } li + lj - 1$$

$$k = \Sigma\, a_n 2^n \quad a_n = 0 \text{ or } 1, n = li + lj \text{ to } li + lj + lk - 1$$

(li, lj and lk being respectively the i, j and k bits field lengths);

b—building one table per each one of the plurality of said i, j, k . . . bit stream fields said Ti, Tj, Tk, . . . tables comprising the elements in the Galois Field corresponding to said corresponding to all the possible bit streams of the bits stream fields considered; said tables comprising the Galois Field elements corresponding to 0, 1 . . . li–1 for table Ti, to the multiples of $\Sigma 2^n$ n=0 to li–1 for table Tj, to the multiples of $\Sigma 2^n$ n=li to li+lj–1 for table Tk . . . ;

c—reading the first bit stream in the bit stream field among the plurality of i, j, k . . . bit streams fields having the LSB of the m bit stream;

d—reading in the first table corresponding to said first bit stream the corresponding element of the Galois Field;

e—If said first bit stream includes the MSB of the m bit stream, executing step j; else, f—reading one second bit stream being the bit stream in said plurality of i, j, k . . . bit stream fields the immediately higher MSB than said first bit stream;

g—reading in the second table corresponding to said second bit stream the corresponding element of the Galois Field;

h—performing a Galois Field multiplication on the elements of the Galois Field found in the previous steps, by multiplying the polynomials of modulo 2 coefficients representing said first and second bit streams and taking from the resulting polynomial the remainder of its polynomial division by the generator polynomial, said remainder becoming the first bit stream;

i—if said second bits field does not include the MSB of the m bit stream, going to step f; else, j—reading the initial message bit stream M and the modified message M' and calculating the polynomial difference M–M' between the polynomial representation of the messages;

k—calculating the remainder of the polynomial division of the delta result of the preceding step by the generator polynomial;

l—performing a Galois Field multiplication on the polynomials representing said first bit stream and the polynomial resulting of step k and taking from the resulting polynomial the remainder of its polynomial division by the generator polynomial;

m—calculating the polynomial addition of the polynomial resulting of step k and the polynomial representing the FCS bit stream of the initial message M.

Applying this general method, we can further see that the size of these tables, is drastically reduced if we take into account the characteristics of the kind of messages usually conveyed by the kind of network of the field of the invention. However, the same kind of simplifications as follows for the preferred embodiment can be adapted to any FCS chosen as Error-detecting coding or any of the high speed packet switching networks.

The high speed packet switching network of the preferred embodiment of the invention is a Frame Relay network. The polynomial generator G considered for the error code used in the Frame Relay packets is the polynomial of degree 16 from the CCITT recommendation:

$$G(X)=X^{16}+X^{12}+X^5+1$$

It is not an irreducible polynomial since it is the product of two polynomials:

$$X^{16}+X^{12}+X^5+1=(X^{15}+X^{14}+X^{13}+X^{12}+X^4+X^3+X^2+X+1)\times(X+1)$$

The first factor in the second element of the above expression is irreducible. Therefore, the Galois Field generated by G has $2^{15}-1$ elements (and not $2^{16}-1$ as if G was an irreducible generator polynomial of degree 16).

FIG. 3 represents in one table a part of the Galois Field whose the root is $\alpha$ and is generated by the CCITT generator polynomial of degree 16, G. In fact, only the odd combinations are generated by G. The left column is filled with the powers of $\alpha$ representing the elements of the Galois Field and the right column is filled with the corresponding bit streams Vector, knowing that the MSB are on the left. There are 32767 ($2^{15}-1$) elements in the Galois Field (it is also said that the 'length' of the Galois Field is 32767). $\alpha^0$ is the identity element in the Galois Field for the multiplication. For FCS calculation using expression 1, storing all the elements $\alpha^m$ of the Galois Field means storing $16\times32767$ bits.

The field of the messages to be altered is on a byte boundary (usually an intermediate network node in packet switching network modifies addresses for performing the routing functions). In consequence, the distance m between the end of the altered field and the end of the message may be expressed in number of bytes instead of number of bits and not all the GF elements might have to be stored. The Galois Field element to be stored are:

$$\alpha^0, \alpha^8, \alpha^{16}, \ldots, \alpha^{8n}, \ldots, \alpha^{32760}$$

This table is sufficient in the case where the maximum message size and thus the m values (=8n) are not greater than 32760. In the intermediate Frame Relay network nodes, the maximum message size is 8K bytes ($2^{13}$ bytes). In this case p is not greater than 1:

$$m=2^{15}+\Sigma\, a_n 2^n\ a_n=0\ \text{or}\ 1, n=3\ \text{to}\ 11,$$

$$M=\Sigma\, a_n 2^n\ a_n=0\ \text{or}\ 1, n=3\ \text{to}\ 11$$

$$32760 \leq M < 8\ M\ \text{is a multiple of 8}$$

$$m=32768+M$$

$$m=32767+1+M$$

$$m=1+M\ \text{modulo}\ 32767$$

$$\alpha^m=\alpha^{1+M}$$

This expression is therefore used when m is greater than 32767, the length of the Galois Field.

This implies that 2 tables are necessary to store the values of $\alpha^m$:

$$\alpha^0, \alpha^8, \alpha^{16}, \ldots, \alpha^{8n}, \ldots, \alpha^{32760}$$

$$\alpha^1, \alpha^9, \alpha^{17}, \ldots, \alpha^{8n+1}, \ldots, \alpha^{32761}$$

for frame relay, as the maximum number of bytes for the message size, including the FCS, is 8K byte. Thus, m will be smaller than $2^{13}$ bytes.

There are two cases:

either m is smaller than the length of the Galois Field 32767 bits and as m is a multiple of 8, m is smaller than the first greater multiple of 8 than the length of the Galois Field (m<82768), expressed in bytes we have:

$$m'=\Sigma\, a_n 2^n\ a_n=0\ \text{or}\ 1, n=0\ \text{to}\ 11$$

using the splitting of m' we have $$m'=i+j+k$$

$$8m'=8i+8j+8k$$

$$\alpha^m=\alpha^{8m'}=\alpha^{8i}\otimes\alpha^{8j}\otimes\alpha^{8k}$$

either m is greater than the length of the Galois Field:

$$m'=2^{12}+\Sigma\cdot a_n 2^n\ a_n=0\ \text{or}\ 1, n=0\ \text{to}\ 11$$

$$M'=\Sigma\, a_n 2^n\ a_n=0\ \text{or}\ 1, n=0\ \text{to}\ 11$$

$$M=8M'$$

$$m'=4096+M'$$

Using the splitting of M' we have:

$$M'=i+j+k$$

$$m'=4096+i+j+k$$

$$8m'=32768+8i+8j+8k$$

$$\alpha^m=\alpha^{8m'}=\alpha^{1+8i}\otimes\alpha^{8j}\otimes\alpha^{8k} \quad \text{(expression 5)}$$

Expression 5 shows that one can use the i, j, k, m' values in bytes to calculate $\alpha^m$.

Such a mode of operation (choose one table among two) is used later in the logical block diagram of FIG. 4 and FIG. 5 instead of the 'modulo' calculation as in the step a of the general method described in FIG. 7. This is a simplification as it is more easily implemented than the formal 'modulo' calculation.

Generalizing this simplification to a bytes based network in the case where m' is greater than the greatest multiple of 8 smaller than the length of the Galois Field (4095):

$$m'=\Sigma\, a_n 2^n\ a_n=0\ \text{or}\ 1, n=0\ \text{to}\ R$$

$$m'=2^{12}\, r+M$$

$$M=\Sigma\, a_n 2^n\ a_n=0\ \text{or}\ 1, n=0\ \text{to}\ 11$$

$$r=\Sigma\, a_n 2^n\ a_n=0\ \text{or}\ 1, n=0\ \text{to}\ R-12$$

$$8m'=32768\times r+8M$$

$$8m'=r+8M\ \text{modulo}\ 32767$$

$$\alpha^m=\alpha^{8m'}=\alpha^{r+8M}$$

This implies that r+1 tables are necessary to store the values of $\alpha^m$:

$$\alpha^0, \alpha^8, \alpha^{16}, \ldots, \alpha^{8n}, \ldots, \alpha^{32760}$$

$$\alpha^1, \alpha^9, \alpha^{17}, \ldots, \alpha^{8n+1}, \ldots, \alpha^{32761}$$

$$\alpha^r, \alpha^{r+8}, \alpha^{r+16}, \ldots, \alpha^{8n+r}, \ldots, \alpha^{32760+r}$$

if M is split into i+j+k $$\alpha^m = \alpha^{8m'} = \alpha^{r+8i} \otimes \alpha^{8j} \otimes \alpha^{8k}$$

In the intermediate Frame Relay network nodes the length of the altered field does not exceed 16 bits; in consequence, Δ vector is a degree 15 polynomial. In the case of Frame Relay, the modified field is usually the address field whom the bit stream length is smaller than 15; in consequence the Δ vector bit stream length is smaller than the degree of G and we have the following simplification:

Rem$_G$(Δ vector)=Δ vector
fFCS=iFCS+(Δ vector)⊗$\alpha^i$⊗$\alpha^j$ (expression 4')

In the case of Frame Relay the expression 4' will be used instead of expression 4. This simplification will allow to suppress the block 25 in the general algorithm illustrated in FIG. 2.

Figure 4:
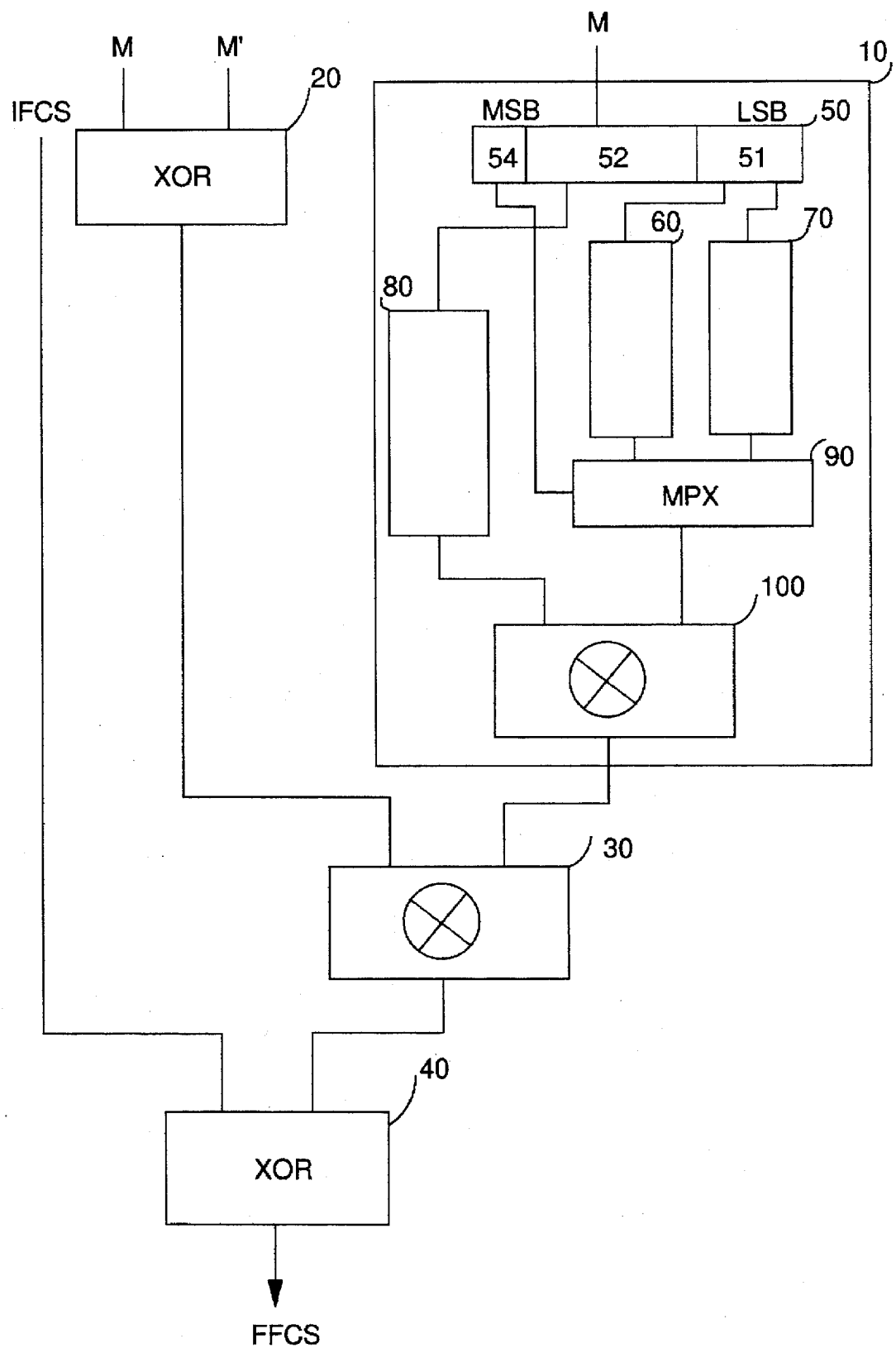
FIG. 4 is the logical block diagram for the fFCS calculation with three tables.
Figure 5:
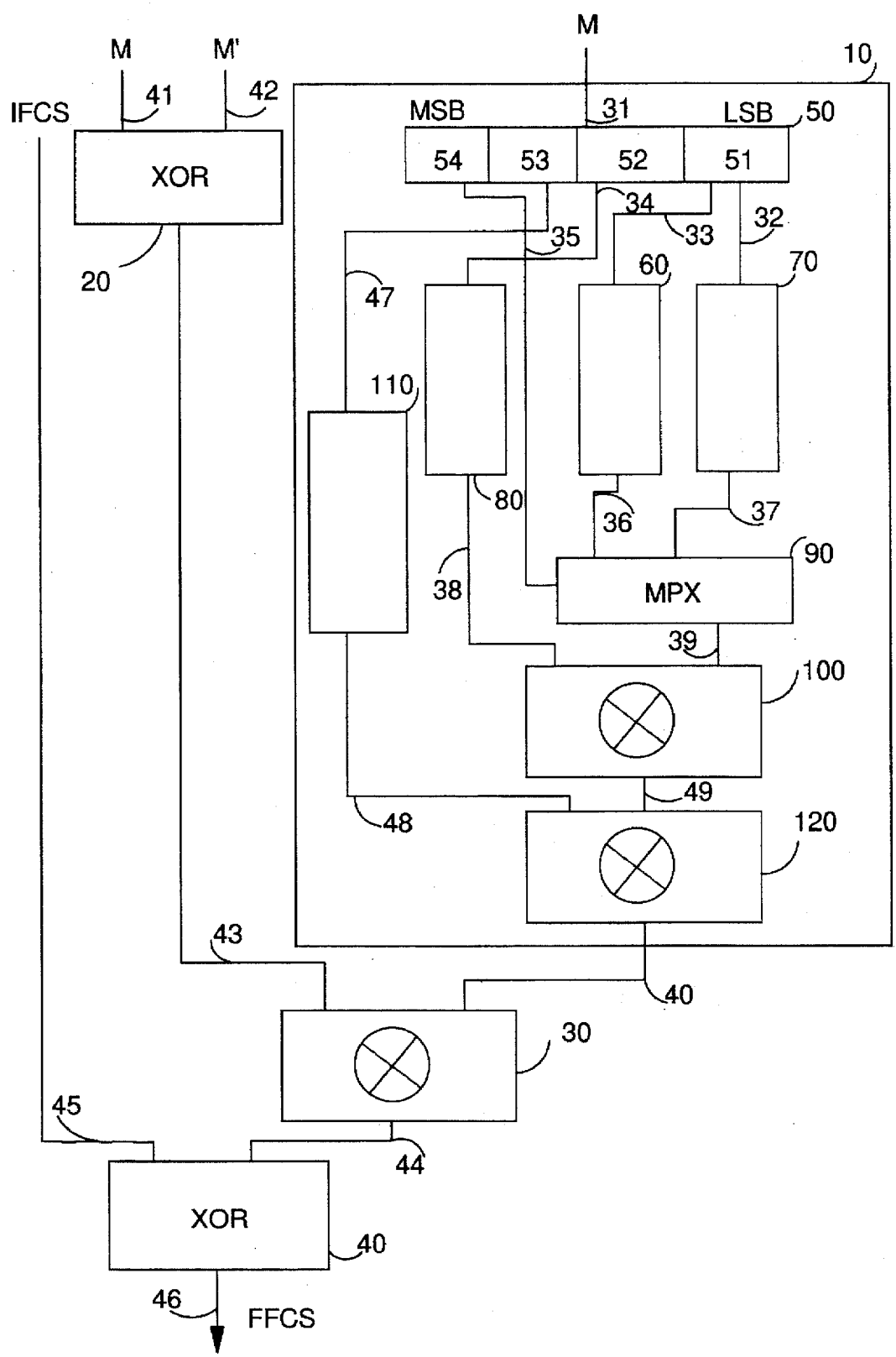
FIG. 5 is the logical block diagram for the fFCS calculation with four tables.

FIG. 4 and FIG. 5 are two logical block diagrams respectively reflecting the general and the Frame Relay simplifications of the invention.

FIG. 4 illustrates the fFCS calculation with three α tables. Particularly the block 10 of FIG. 2 has been expanded. m is the input of block 10; assuming that the distance m in bytes between the last byte of the altered field and the last byte of the data including the message and its FCS (2 bytes) is represented as a 13 bit stream (corresponding to a maximum distance of 8K bytes or $2^{13}$ bytes); it is split in block 50 into three bit streams 51, 52, 54 of respectively 6 bits, 6 bits and one bit starting from the LSB up to the MSB. The first field 51 is provided as an input to block 70 which reads the corresponding GF element in the first table containing the 64 following GF elements:

$$\alpha^0, \alpha^8, \alpha^{16}, \ldots, \alpha^{504}$$

The first field 51 is provided also as an input to block 60 which reads the corresponding GF element in the second table containing the 64 following GF elements:

$$\alpha^1, \alpha^9, \alpha^{17}, \ldots, \alpha^{505}$$

In block 90 are multiplexed (with a logical OR, a multiplexor operator) the three following data: the output of blocks 70 and 60 with the last bit of the bit stream representing m. If this last bit is zero, this means that the distance m is more than $2^{12}$ bytes and thus a number greater than and that the GF element for the field 51 will be read in the table of block 60. If the last bit of field 54 is zero, the distance m is less than $2^{12}$ bytes and the GF element for the field 51 will be read in the table of block 70. In block 80, the input is the bit stream of the field 52 and the corresponding GF element is read in the third table containing the 64 following elements:

$$\alpha^0, \alpha^{512}, \alpha^{1024}, \ldots, \alpha^{512n}, \ldots, \alpha^{32256}$$

In block 100 is performed a GF 16×16 bits multiplication between the GF element, output of block 90 and the GF element output of block 80. The result of block 100 is sent to block 30. The block 20 is the one described in FIG. 2. The output is Δ vector. Compared to FIG. 2, the block 25 is no more necessary. The output of blocks 20 and 100 are sent as input to block 30 where is performed a GF 16×16 multiplication of the inputs. The result is sent to block 40. Block 40 is the XOR on iFCS and the output of block 30, the result being fFCS.

FIG. 5 illustrates the fFCS calculation with four α tables. This logical block diagram differs from the one of FIG. 4 in the expanded part 10. The input data of block 50 is the bit stream representing the number of bytes m of the distance between the last byte of the altered message and the end of data including the message and its FCS. In block 50, the m bit stream is split into four bits fields 51, 52, 53 and 54. This will induce the splitting of GF elements into four tables. This could be convenient have small tables stored instead of less tables but of larger size. The four bit stream 51, 52, 53, 54 have respectively 4 bits, 4 bits, 4 bits and one bit starting from the LSB up to the MSB. The first field 51 is provided as an input to block 70 which is for reading the corresponding GF element in the first table containing the 16 following GF elements:

$$\alpha^0, \alpha^8, \alpha^{16}, \ldots \alpha^{120}$$

The first field 51 is provided also as an input to block 60 which is for reading the corresponding GF element in the second table containing the 16 following GF elements:

$$\alpha^1, \alpha^9, \alpha^{17}, \ldots, \alpha^{121}$$

In block 90 are multiplexed (with a logical OR, a multiplexor operator) the three following data: the output of blocks 70 and 60 with the last bit of the bit stream representing m. If this last bit is non zero, this means that the distance m is more than 12 bytes and thus a number greater than and that the GF element for the field 51 will be read in the table of block 60. If the last bit of field 54 is zero, the distance m is less than 12 bytes and the GF element for the field 51 will be read in the table of block 70. In block 80, the input is the bit stream of the field 52 and the corresponding GF element is read in the third table containing the 16 following elements:

$$\alpha^0, \alpha^{128}, \alpha^{256}, \ldots \alpha^{128n}, \ldots, \alpha^{1920}$$

In block 100 is performed a GF 16×16 bits multiplication between the GF element output of block 90 and the GF element output of block 80. The result of block 100 is sent to block 120. In block 110, the input is the bit stream of the field 53 and the corresponding GF element is read in the fourth table containing the 16 following elements:

$$\alpha^0, \alpha^{2048}, \alpha^{4096}, \ldots, \alpha^{2048n}, \ldots, \alpha^{30720}$$

In block 120 is performed a GF 16×16 bits multiplication between the GF element output of block 100 and the GF element output of block 110. The result of block 100 is sent to block 30.

The GF 16×16 bits multiplication (⊗) consists in multiplying the two bit stream and to calculate the remainder of the division of the result by the generator polynomial bit stream. The generator polynomial we are talking about is the CCITT generator polynomial of degree 16:

$$G = X^{16} + X^{12} + X^5 + 1$$

Figure 6:
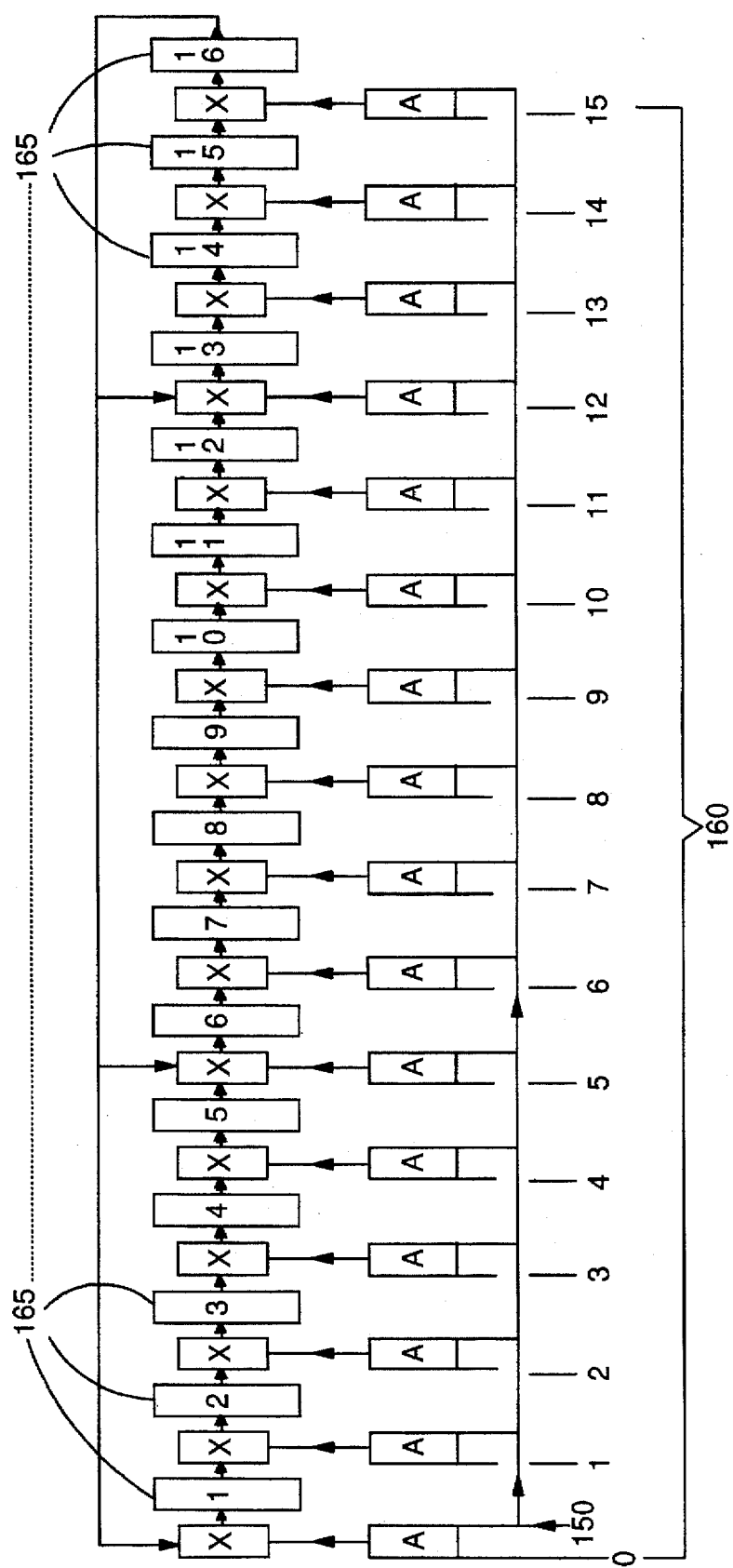
FIG. 6 is a hardware implementation of the Galois Field 16×16 multiplication.

The GF 16×16 bits multiplication (⊗) is an already known operation which can have either a hardware or a software implementation. A known hardware implementation is illustrated in FIG. 6. It is a Linear Feedback Shift Register (LFSR) including 16×1 bit shift registers (165), 16 Nand gates (A) and XORs (X) with feedbacks. One of the multiplicands is placed on the parallel inputs (160) while the other multiplicand is serially entered (150) (MSB first). After 17 shifts the remainder is within the register ready to be used. The other two operations of the block diagram of FIG. 4 and FIG. 5 are simple: they are implemented with a 2-ways 16 bit multiplexor (block 90) and a 16 bit 2-way XOR for the modulo 2 addition 40. The plurality of GF 16×16 bits multiplication (⊗) will be processed either in parallel or serially. However, it is possible to have a serial implementation with only one operator implemented and used as many times as the number of tables. For an implementation optimizing the process time, and it is the process chosen for the preferred embodiment, the process will be done in parallel with as many operators as the number of tables.

FIG. 5 illustrates this hardware implementation knowing that the m value which represents the number of bytes is sent on a 13 bits bus (31) to block 50 which is a 13 bits register. The field 51 is a 4 bits field sent on the 4 bits bus 32 as an address in the RAM represented by the block 70. These bits are also sent via the 4 bits bus 33 as an address in the RAM represented by the block 70. In output to these two RAMs are sent the two 16 bits fields on buses 37 and 36 for respectively RAMs 70 and 60. These data enter a 2-ways 16 bits multiplexor 90. Also entering the multiplexor 90, a unit bit read from the last position of the register 50 and sent on the one bit bus 35. The output of the multiplexor 90 is a 16 bits vector sent on the 16 bits bus 39 to the LFSR. The 4 bits field 52 of the 13 bits register 50 is sent on the 4 bits bus 34 as the address of the RAM represented by the block 80. The output of this RAM is sent on the 16 bits bus 38 to the LFSR 100. The output of the LFSR 100 which is the result of the operation between the two input vectors is sent on bus 49 to the next LFSR represented by the block 120. The 4 bits field 53 of the 13 bits register 50 is sent on the 4 bits bus 47 as the address of the RAM represented by the block 110. The output of this RAM 110 is sent on the 16 bits bus 48 to the LFSR 120. The result of the operation in the LFSR 120 between the two inputs conveyed on the buses 48 and 49 is a 16 bits vector sent on bus 40 to the next LFSR 30. The vectors M and M' which respectively represent the message arriving at the intermediate network node and the message modified in this node are sent on the two 16 bits buses 41 and 42 to the 2-ways XOR operator represented by the block 20. The output of the XOR operator is sent on the 16 bits bus 43 to the LFSR 30. The output of LFSR 30 which is the 16×16 GF multiplication of the two 16 bits vectors conveyed on buses 40 and 43 is a 16 bits vector sent on bus 44 to the next 2-ways XOR operator represented by the block 40. The second input of this operator is the initial FCS, iFCS, the FCS of the message M entering the intermediate network node. The output of this 2-ways XOR 40 is available on a 16 bits bus, 46 and is the final FCS, fFCS, which is the FCS of the modified message M' which the expected result of this hardware implementation.

I claim:

1. A method to calculate a modified Frame Check Sequence (FCS) character for a bit stream message (M) conveyed in a packet switching network using a FCS error code based on a generator polynomial G generating a Galois Field for which the root is α, knowing that one field has been modified in said messages; m being the distance from the last bit of the modified field of the message to the last least significant bit of the message including the FCS bits; said method comprising the following steps:

storing the elements of the Galois Field corresponding to said FCS error code;

determining the element in the Galois Field $\alpha^m$ corresponding to m in the stored data;

calculating the delta vector resulting in the difference between the initial and the final bit stream messages not including the FCS bits;

calculating the remainder in the division by the generator polynomial of the delta vector; if the length of the modified bits field is smaller than the degree of G, the remainder being the delta vector itself; performing a Galois Field multiplication of the result of the previous step with said remainder;

adding the result of the previous step with the initial error code, the result being the final error code which is the error code of the modified message.

2. The method of claim 1 where:

the storing step includes the following step:

building a lookup table with all the elements of the Galois Field corresponding to said FCS error code;

and the determining step includes the following step:

pointing in the lookup table to the element in the Galois Field $\alpha^m$ corresponding to m.

3. The method of claim 1 where:

the storing step includes the following steps:

splitting the bit stream representing m into a plurality of bit streams;

building a plurality of tables comprising the possible elements of the Galois Field generated by the generator polynomial G of the error code; each table corresponding to all the possible values of the bit streams coming from the splitting of the m bit stream;

and the determining step includes the following steps:

for each bits field, pointing in each corresponding lookup table to the corresponding element in the Galois Field;

starting with the LSB bits fields, performing recurrent multiplications in the Galois Field of a Galois Field element found in a lookup table with the Galois Field element found in the previous lookup table.

4. The method of any one of claims 1 to 3 further comprising the following initial step:

if m is greater than the length of the Galois Field ,l, calculating and replacing m its congruent value modulo l.

5. The method of any of claims 1 to 3 where a high speed packet network messages are bytes based, the lookup tables only storing the Galois Field elements corresponding to the multiple of 8, said method comprising the following additional steps:

isolating in one bit stream, the MSB bit stream of the m bit stream above the length of the Galois Field; r being the integer represented by said MSB bit stream; and if said MSB bit stream is not empty, building r additional tables from the table corresponding to the bit stream including the-LSB of the m bit stream, comprising the Galois Field elements respectively corresponding to the values 8n+1, 8n+2 . . . , 8n+r; and in the determining step, pointing, for the bit stream including the LSB of the m bit stream corresponding to 8n, in the r+8n table instead of the 8n table if said MSB bit stream is not empty.

6. The method of any of claims 1 to 3 where a high speed packet network is a Frame Relay network, said method comprising the following additional steps:

isolating in the m bit stream, the highest MSB bit;

if said MSB bit is not zero, building an additional table from the table corresponding to the bit stream including the LSB of the m bit stream, comprising the Galois Field elements respectively corresponding to the values 8n+1; and in the determining step, pointing, for the bit stream including the LSB of the m bit stream corresponding to 8n, in the 8n+1 table instead of the 8n table if said MSB bit is not zero.

7. An apparatus for calculating a modified Frame Check Sequence (FCS) character for a bit stream messages (M) conveyed in a high speed packet switching network using an FCS error code based on a generator polynomial G generating a Galois Field for which the root is α, knowing that one bit stream field has been modified in said messages; m being the distance from the last bit of the modified field of the message to the last least significant bit of the message including the FCS bits; said apparatus comprising:

means for storing the elements of the Galois Field corresponding to said FCS error code;

means for determining, in the data stored, the element in the Galois Field $\alpha^m$ corresponding to m;

means for XORing the two bit streams corresponding to the initial message and the modified message said messages not including the FCS fields, the result being a delta vector;

means for calculating the remainder in the division by the generator polynomial of said delta vector; if the length of the modified bits field is smaller than the degree of G, the remainder being the delta vector itself;

means for performing a Galois Field multiplication of the result of the previous step with said remainder;

means for adding the result of the previous step with the initial error code, the result being the final error code which is the error code of the modified message.

8. The apparatus of claim 7 where:

the means for storing is a lookup table with all the elements of the Galois Field corresponding to said FCS error code;

and the means for determining is a means to read in the lookup table the element at the address m.

9. The apparatus of any one of claims 7 to 8 where the high speed packet network messages are byte based, the lookup tables only storing the Galois Field elements corresponding to the multiple of 8, said method comprising the following additional means:

means to isolate in one bit stream, the MSB bit stream of the m bit stream above the length of the Galois Field; r being the integer represented by said MSB bit stream; and if said MSB bit stream is not empty, r additional tables from the table corresponding to the bit stream including the LSB of the m bit stream, comprising the Galois Field elements respectively corresponding to the values 8n+1, 8n+2 . . . , 8n+r; and the means for determining includes means to select the r+8n table if said MSB bit stream is not empty, the 8n table else, to point in, for the bit stream including the LSB of the m bit stream corresponding to the address 8n.

10. The apparatus of claim 7 where:

the means for storing comprises the following means:

means for reading the bit stream representing m as a plurality of bit streams;

a plurality of tables comprising the possible elements of the Galois Field generated by the generator polynomial G of the error code; each table corresponding to all the possible values of the bit streams produced by the splitting of the m bit stream;

and the means for determining includes the following means:

for each bit field used as an address, means to read in each corresponding lookup table the corresponding element of the Galois Field;

a plurality of means, one per lookup table, to perform recurrent multiplications in the Galois Field of a Galois Field element found at the address read in one of the bit streams in the lookup table, with the Galois Field element found in the previous lookup table starting with the LSB bits fields.

11. The apparatus of any one of claims 7 to 10 further comprising the following means:

means to calculate and to replace m, if m is greater than the length of the Galois Field ,1, by its congruent value modulo l.

12. The apparatus of claim 11 where the means to select one among the 2 tables is a 2-ways 16 bits multiplexor (90).

13. The apparatus of any one of claims 7 to 10 where the high speed packet network is a Frame Relay network, said apparatus method comprising the following additional means:

means to isolate in one bit stream, the MSB bit of the m bit stream; and if said MSB bit stream is not empty, 1 additional table from the table corresponding to the bit stream including the LSB of the m bit stream, comprising the Galois Field elements corresponding to the values 8n+1; and the means for determining includes means to select the table 8n+1 if said MSB bit is not zero, the 8n table else, for the bit stream including the LSB of the m bit stream corresponding to the address 8n.

14. The apparatus of claim 10 where the means to select one among the r tables is a r-ways 16 bits multiplexor.

* * * * *